US008578316B1

(12) United States Patent
Joshi et al.

(10) Patent No.: US 8,578,316 B1
(45) Date of Patent: *Nov. 5, 2013

(54) METHODOLOGIES FOR AUTOMATIC 3-D DEVICE STRUCTURE SYNTHESIS FROM CIRCUIT LAYOUTS FOR DEVICE SIMULATION

(75) Inventors: Rajiv V. Joshi, Yorktown Heights, NY (US); Ajay N. Bhoj, Princeton, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/607,678

(22) Filed: Sep. 8, 2012

Related U.S. Application Data

(63) Continuation of application No. 13/447,344, filed on Apr. 16, 2012.

(51) Int. Cl.
*G06F 17/50* (2006.01)
(52) U.S. Cl.
USPC ............. 716/124; 716/55; 716/110; 716/125; 716/139
(58) Field of Classification Search
USPC .............................. 716/55, 110, 124–125, 139
See application file for complete search history.

(56) References Cited

U.S. PATENT DOCUMENTS

| | | | | |
|---|---|---|---|---|
| 6,330,704 B1 * | 12/2001 | Ljung et al. | | 716/115 |
| 6,732,338 B2 * | 5/2004 | Crouse et al. | | 716/112 |
| 6,904,395 B1 | 6/2005 | DeJack et al. | | |
| 6,947,879 B2 | 9/2005 | Yamada et al. | | |
| 7,124,069 B2 * | 10/2006 | Meuris et al. | | 703/13 |
| 7,131,105 B2 | 10/2006 | Lorenz et al. | | |
| 7,386,817 B1 * | 6/2008 | Fiorenza et al. | | 716/136 |
| 7,409,667 B1 | 8/2008 | Pritchard et al. | | |
| 7,530,034 B2 | 5/2009 | Betz et al. | | |
| 7,627,836 B2 * | 12/2009 | Culp et al. | | 716/53 |
| 7,730,444 B2 | 6/2010 | Itoh et al. | | |
| 7,816,253 B2 * | 10/2010 | Chen et al. | | 438/622 |
| 7,821,110 B2 | 10/2010 | Kim et al. | | |
| 7,870,527 B2 | 1/2011 | Tsai | | |

(Continued)

OTHER PUBLICATIONS

Buturla et al.; "Finite-Element Analysis of Semiconductor Devices: The FIELDAY Program"; IBM Journal of Research and Development vol. 25, No. 4; Jul. 1981; pp. 218-231.*

(Continued)

*Primary Examiner* — Naum Levin
(74) *Attorney, Agent, or Firm* — Scully, Scott, Murphy & Presser, P.C.; Preston J. Young, Esq.

(57) ABSTRACT

A method of automatically generating structure files employing a full structure generator automated program is provided. An annotated device layout file is generated from a design layout by annotating the codes for design shapes with additional text representing the functionality of a physical structure associated with each design shape. Functioning individual semiconductor devices are identified from the annotated device layout file, and a circuit area including multiple interconnected semiconductor devices are identified. A front-end-of-line (FEOL) device structure file and a back-end-of-line (BEOL) device structure file are generated from layer by layer analysis of the components of the annotated device layout within the circuit area. Finite element meshes (FEMs) are generated for the FEOL and BEOL structure files and merged to provide a structure file that can be employed for simulation of semiconductor devices therein.

16 Claims, 12 Drawing Sheets

(56) References Cited

U.S. PATENT DOCUMENTS

| | | | |
|---|---|---|---|
| 7,904,869 B2 | 3/2011 | Yu et al. | |
| 8,207,757 B1* | 6/2012 | Chen et al. | 326/104 |
| 2003/0028360 A1 | 2/2003 | Bochobza-Degani et al. | |
| 2005/0125750 A1 | 6/2005 | Lorenz | |
| 2007/0222081 A1* | 9/2007 | Chen et al. | 257/773 |
| 2008/0263492 A1 | 10/2008 | Chuang et al. | |
| 2009/0055789 A1 | 2/2009 | McIlrath | |
| 2009/0064058 A1 | 3/2009 | McIlrath | |
| 2010/0005437 A1 | 1/2010 | McIlrath | |
| 2010/0155953 A1 | 6/2010 | Bornstein | |
| 2010/0332193 A1 | 12/2010 | Hu et al. | |
| 2011/0016446 A1 | 1/2011 | Krebs | |
| 2011/0283245 A1 | 11/2011 | Shen et al. | |
| 2011/0313747 A1* | 12/2011 | Joshi et al. | 703/14 |
| 2011/0313748 A1 | 12/2011 | Li | |
| 2012/0005633 A1 | 1/2012 | Ramakrishnan et al. | |
| 2012/0064567 A1 | 3/2012 | Stakenborg et al. | |
| 2012/0102441 A1 | 4/2012 | Aton et al. | |
| 2012/0147689 A1 | 6/2012 | Scheuerlein et al. | |

OTHER PUBLICATIONS

Gayer et al.; "A software platform for nanoscale device simulation and visualization"; IEEE International Conference; Jul. 2009; pp. 432-437.*

Jeong et al.; "Assessing Chip-Level Impact of Double Patterning Lithography"; Quality Electronic Design (ISQED), 2010 11th International Symposium; Publication Year: 2010 , pp. 122-130.*

Buturla, E.M. et al., "Finite-Element Analysis of Semiconductor Devices: The FIELDAY Program" IBM Journal of Research and Development (Jul. 1981) pp. 218-231, vol. 25, No. 4.

Gayer, M. et al., "A Software Platform for Nanoscale Device Simulation and Visualization" IEEE International Conference (Jul. 15-17, 2009) pp. 432-437.

Office Action, dated Dec. 7, 2012, recieved in a related U.S. Patent Application, namely U.S. Appl. No. 13/447,344.

Bhoj, A. et al., "Hardware Assisted 3D TCAD Based Capacitance Optimization in 32nm Planar SOI SRAMs" IEDM Washington DC Conference (Dec. 5-7, 2011).

* cited by examiner

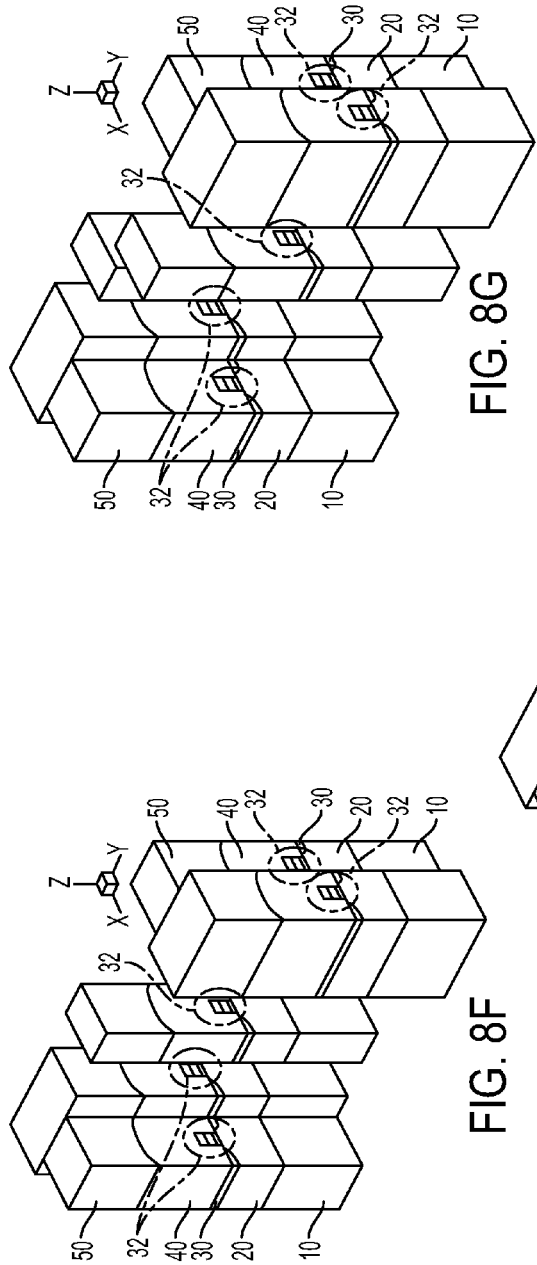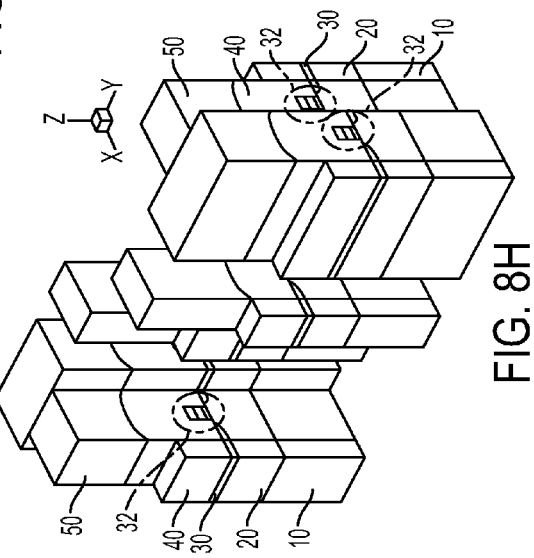

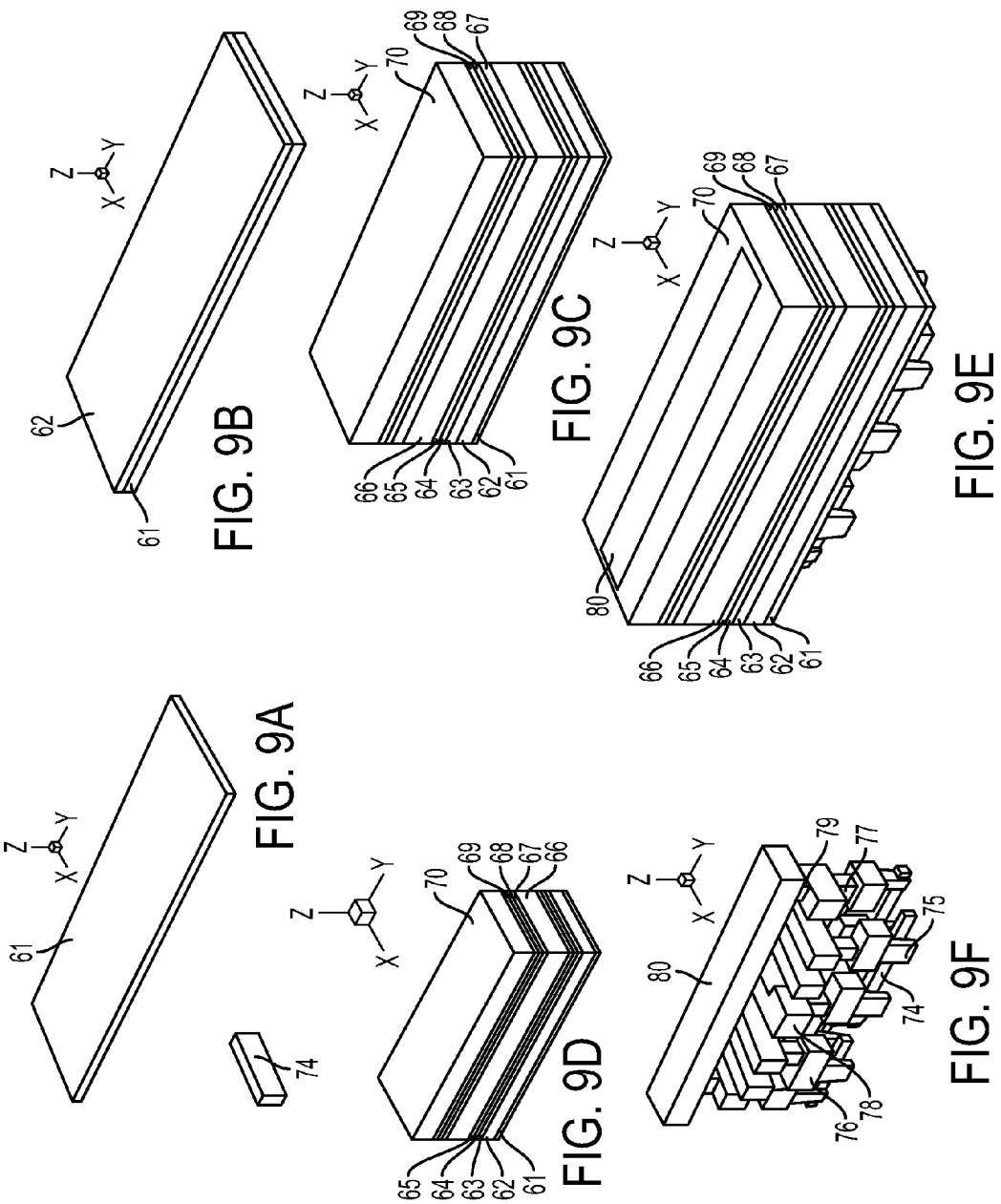

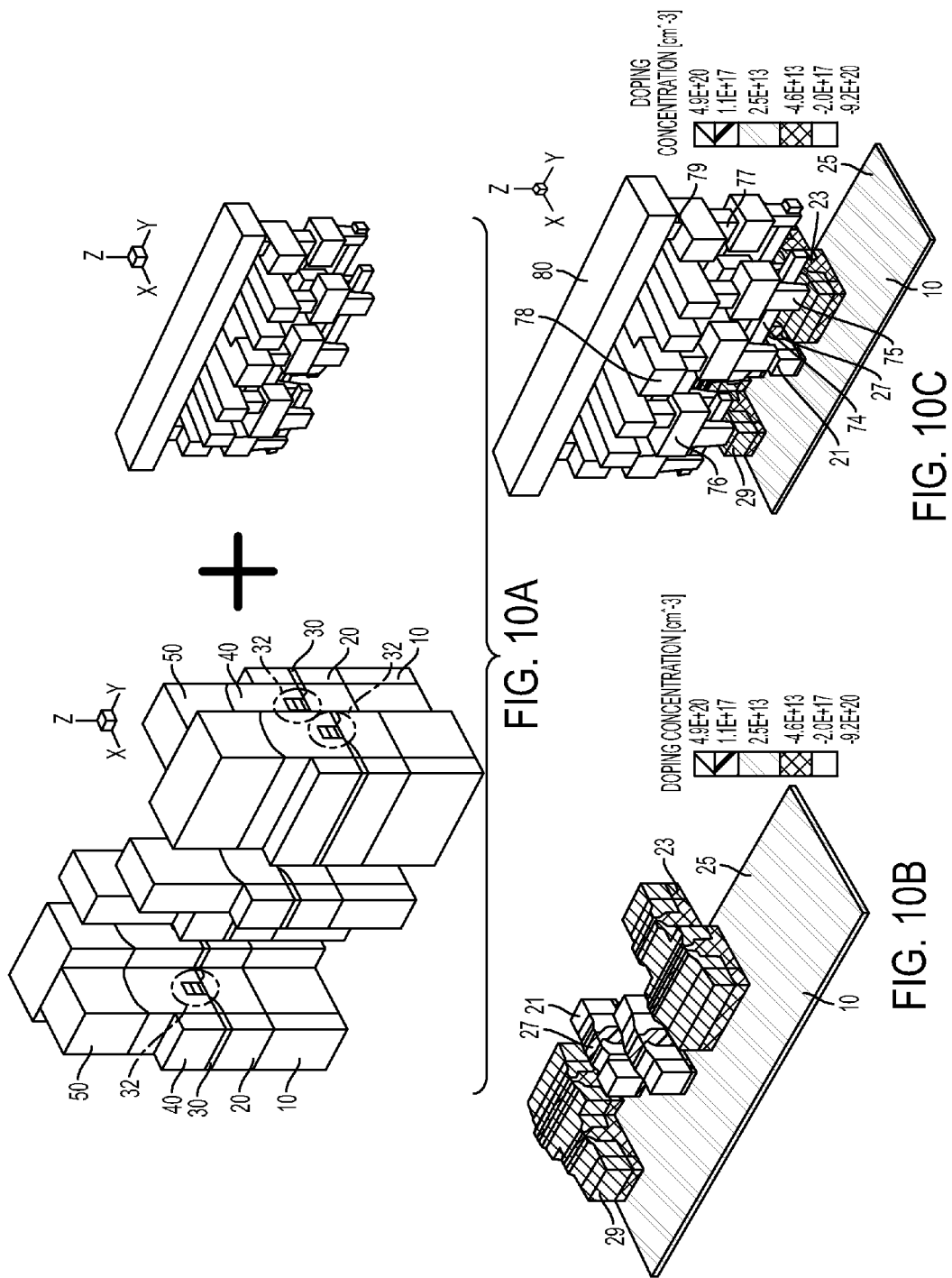

METHODOLOGIES FOR AUTOMATIC 3-D DEVICE STRUCTURE SYNTHESIS FROM CIRCUIT LAYOUTS FOR DEVICE SIMULATION

CROSS REFERENCE TO RELATED APPLICATION

This application is a continuation of U.S. patent application Ser. No. 13/447,344, filed Apr. 16, 2012 the entire content and disclosure of which is incorporated herein by reference.

BACKGROUND

The present disclosure generally relates to methodologies for automatically generating three-dimensional device structures corresponding to arbitrary design layouts of semiconductor devices for three-dimensional technology computer aided design (TCAD) device simulations, and a system for implementing the same.

Three-dimensional (3D) technology computer aided design (TCAD) based device simulation is crucial for device modeling for semiconductor devices at semiconductor technology nodes beyond the 45 nm node. 3D TCAD based design simulation can aid in, for example, capacitance extraction, I-V data calibration, and study of 3D effects.

In order for a 3D TCAD based device simulation to be helpful, the physical structure of the device under simulation must be captured accurately in a structure file that lists three-dimensional features of the device under simulation. Specifically, the three-dimensional features include the boundary representation of device, the materials involved, doping profiles, contacts to the device, and mesh geometries over which physical model equations are solved.

Traditional Technology CAD (TCAD) methodologies focus on process simulations in two dimensions and three dimensions to obtain an accurate representation of the device or the structure file. Traditional TCAD methodologies are limited to single or few device instances owing to the computational costs/time intensive nature of process simulation, and hence the structure file for layouts is created manually using approximate doping profiles, etc. This is accomplished either through an interactive graphic user interface (GUI) editor or a script detailing interactions of various bodies and their overlap behavior. Parameterization of the TCAD methodologies is limited.

However, generation of a structure file corresponding to a 3D device structure of any design layout has proven to be a major challenge. Particularly, incorporating the same set of process assumptions for any layout to produce the correct boundary representation of the layout devices has been a tedious and difficult manual process. Further, such manual coding of device structures to generate a structure file has proven to be error prone, labor intensive, and time-consuming because all process layers and geometries need to be accounted for. Thus, generation of a structure file compatible with device simulation has been a significant bottleneck in product development cycles. Further, iterative modification of circuit layouts with feedback from CAD based device simulation has been impractical.

Overall, manual structure file generation is time consuming, error prone, iterative. There is no guarantee that process assumptions for different layouts coded up by different TCAD engineers are the same. Thus, a cumbersome manual check is necessary. In addition, it is difficult to change process assumptions on the fly—i.e., to test the same layout with different versions of process assumptions and/or different evaluation versions. Further, it is extremely hard to deal with generic layouts employing the manual structure file generation method. As a result, electronic design automation (EDA) tools are inefficiently utilized as most of the time is spent in structure coding for the tool rather than using the EDA tools.

SUMMARY

A method of automatically generating structure files employing a full structure generator automated program is provided. The full structure generator automated program uses an annotated device layout file as an input and employs a set of algorithms to automatically generate the structure files. The annotated device layout file is generated from a design layout by annotating the codes for design shapes with additional text representing the functionality of a physical structure associated with each design shape. Functioning individual semiconductor devices are identified from the annotated device layout file, and a circuit area including multiple interconnected semiconductor devices are identified. A front-end-of-line (FEOL) device structure file and a back-end-of-line (BEOL) device structure file are generated from layer by layer analysis of the components of the annotated device layout within the circuit area. Finite element meshes (FEMs) are generated for the FEOL and BEOL structure files and merged to provide a structure file that can be employed for simulation of semiconductor devices therein.

The generation of the FEOL and BEOL structure files can be performed employing a generic FEOL structure file generator automated program and a generic BEOL structure file generator automated program, which can operate on any region of an arbitrary annotated device layout file without recoding. Thus, the generic FEOL structure file generator automated program and the generic BEOL structure file generator automated program are layout independent, and are applicable to any arbitrary layout provided that annotation for device components is provided therein. Thus, once the generic FEOL structure file generator automated program and the generic BEOL structure file generator automated program are provided, generation of a structure file from an annotated design layout takes only a minimum amount of time that is needed to run the FEOL and BEOL structure file generator automated programs without requiring any manual coding time. The FEOL and BEOL structure file generator automated programs are also independent of process assumptions. Thus, the method of the present disclosure can seamlessly and promptly switch sets of process assumption files. Also, iterative design layout refinement employing TCAD based simulation feedback is practically feasible depending on the run time of the technology computer aided design (TCAD) automated program. The method of the present disclosure provides high degree of consistency in the structural files corresponding to different layouts in the same process technology in contrast to manually generated structural files. The methods of the present disclosure obviate the need to perform process simulations repetitively with automatic generation of structure files through structure synthesis, thereby reducing the time and memory complexity for generating the structure files for device simulation.

According to an aspect of the present disclosure, a method of manipulating a design layout of at least one device is provided. The method includes: annotating a design layout by adding annotations identifying functional components of at least one device to contact elements on design shapes corresponding to the functional components in the design layout; generating a structure file from the annotated design layout employing an automated program, wherein the automated program analyzes the annotated design layout to construct a structure file representing a three-dimensional representation of the at least one device including finite element meshes (FEMs); and storing the structure file in a non-transitory machine readable data storage medium.

According to another aspect of the present disclosure, a system for manipulating a design layout of at least one device is provided. The system includes: annotating means for automatically annotating a design layout by adding annotations identifying functional components of at least one device to contact elements on design shapes corresponding to the functional components in the design layout; and structure-file-generating means for automatically generating a structure file from the annotated design layout employing an automated program, wherein the automated program analyzes the annotated design layout to construct a structure file representing a three-dimensional representation of the at least one device including finite element meshes.

According to yet another aspect of the present disclosure, a non-transitory machine readable data storage medium embodying an automated program for manipulating a design layout of at least one device is provided. The automated program including steps of: annotating a design layout by adding annotations identifying functional components of at least one device to contact elements on design shapes corresponding to the functional components in the design layout; and generating a structure file from the annotated design layout employing an automated program, wherein the automated program analyzes the annotated design layout to construct a structure file representing a three-dimensional representation of the at least one device including finite element meshes.

BRIEF DESCRIPTION OF THE DRAWINGS

FIG. 8F is a graphic representation of a fifth shortFET-style intermediate FEOL structure file generated from the fourth shortFET-style intermediate FEOL structure file and the annotated design layout according to an embodiment of the present disclosure.

FIG. 8G is a graphic representation of a sixth shortFET-style intermediate FEOL structure file generated from the fifth shortFET-style intermediate FEOL structure file and the annotated design layout according to an embodiment of the present disclosure.

FIG. 8H is a graphic representation of a FEOL structure file generated from the sixth shortFET-style intermediate FEOL structure file and the fifth longFET-style intermediate FEOL structure file of FIG. 7C according to an embodiment of the present disclosure.

FIG. 9A is a graphic representation of a first intermediate back-end-of-line (BEOL) structure file generated from the annotated design layout according to an embodiment of the present disclosure.

FIG. 9B is a graphic representation of a second intermediate BEOL structure file generated from the first intermediate BEOL structure file and the annotated design layout according to an embodiment of the present disclosure.

FIG. 9C is a graphic representation of a third intermediate BEOL structure file generated from the second intermediate BEOL structure file and the annotated design layout according to an embodiment of the present disclosure.

FIG. 9D is a graphic representation of a fourth intermediate BEOL structure file generated from the third intermediate BEOL structure file and the annotated design layout according to an embodiment of the present disclosure.

FIG. 9E is a graphic representation of a fifth intermediate BEOL structure file generated from the fourth intermediate BEOL structure file and the annotated design layout according to an embodiment of the present disclosure.

FIG. 9F is another view of the fifth intermediate BEOL structure file according to an embodiment of the present disclosure.

FIG. 10A is a schematic diagram illustrating a combination of the FEOL structure file and the BEOL structure file according to an embodiment of the present disclosure.

FIG. 10B is a graphic representation of a portion of the FEOL structure file according to an embodiment of the present disclosure.

FIG. 10C is a graphic representation of the structure file according to an embodiment of the present disclosure.

DETAILED DESCRIPTION

Figure 1:
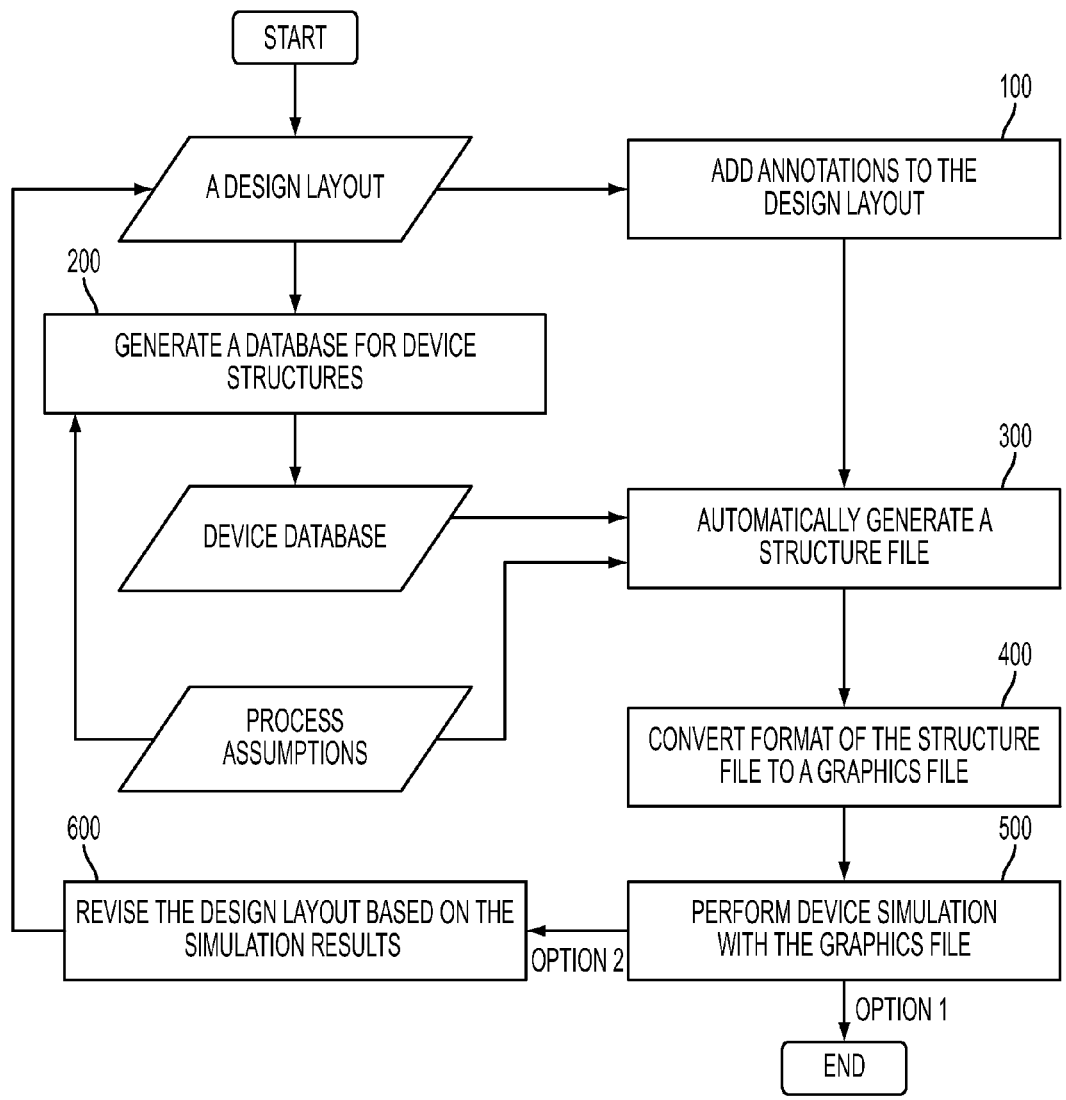
FIG. 1 is a flow chart illustrating the steps of an embodiment of the present disclosure.

As stated above, the present disclosure relates to a method of automatically generating three-dimensional device structures from arbitrary design layouts for semiconductor devices for three-dimensional technology computer aided design (TCAD) device simulations, and a system for implementing the same, which are now described in detail with accompanying figures. It is noted that like reference numerals refer to like elements across different embodiments. The drawings are not necessarily drawn to scale.

As used herein, ordinals such as "first," "second," "third," "fourth," etc. are employed merely to distinguish several similar elements, and the same element may be referred to by different ordinals across the specification and the claims.

As used herein, a "structure file" is a file that includes information on three-dimensional geometrical boundaries of a structure in sufficient detail to enable three-dimensional graphical rendering of the structure.

Referring to FIG. 1, a flow chart illustrating steps of an embodiment of the present disclosure is illustrated. Initially, a design layout is provided. The design layout can be any layout in any format, and includes design shapes at various design levels. If the design layout includes a design for a semiconductor chip, a semiconductor circuit, or at least one semiconductor device, the design layout can include various design levels representing the physical structures of the semiconductor chip, the semiconductor circuit, or the at least one semiconductor device including, but not limited to, recessed oxide (RX) level that defines active areas for semiconductor devices, polysilicon conductor (PC) level that defines extent of gate conductor lines, various implantation mask levels that defines areas of ion implantation either alone or in combination with the shapes for other design levels, contact array via (CA) levels, metal line (MX) levels, metal via (VX) levels, and/or any other design level known in the semiconductor industry.

Referring to step 100, the design layout is annotated by adding annotations to the design layout. The annotation can be performed, for example, by identifying functional components of at least one device. The annotations are added to contact elements on design shapes corresponding to the functional components in the design layout. As used herein, a "contact element" refers to any association point of a design shape in a design layout at which any additional information can be added. A contact element to which additional information is added is herein referred to as a "layout level annotated contact" or "LLAC." In one embodiment, a contact element can be provided as a polygonal shape illustrated in FIG. 2. Annotated polygons of FIG. 2, which is an exemplary design layout in a graphic format, which are contact elements having polygonal shapes and having additional information through annotation, are examples of layout level annotated contacts. The contact elements and the layout level annotated contacts can be provided as a separate level in a design layout. In one embodiment, layout annotations can be automatically added from schematic labels using electronic design automation (EDA) verification soft such as layout versus schematic (LVS) facility in circuit CAD tools such as Cadence Virtuoso™.

Figure 2:
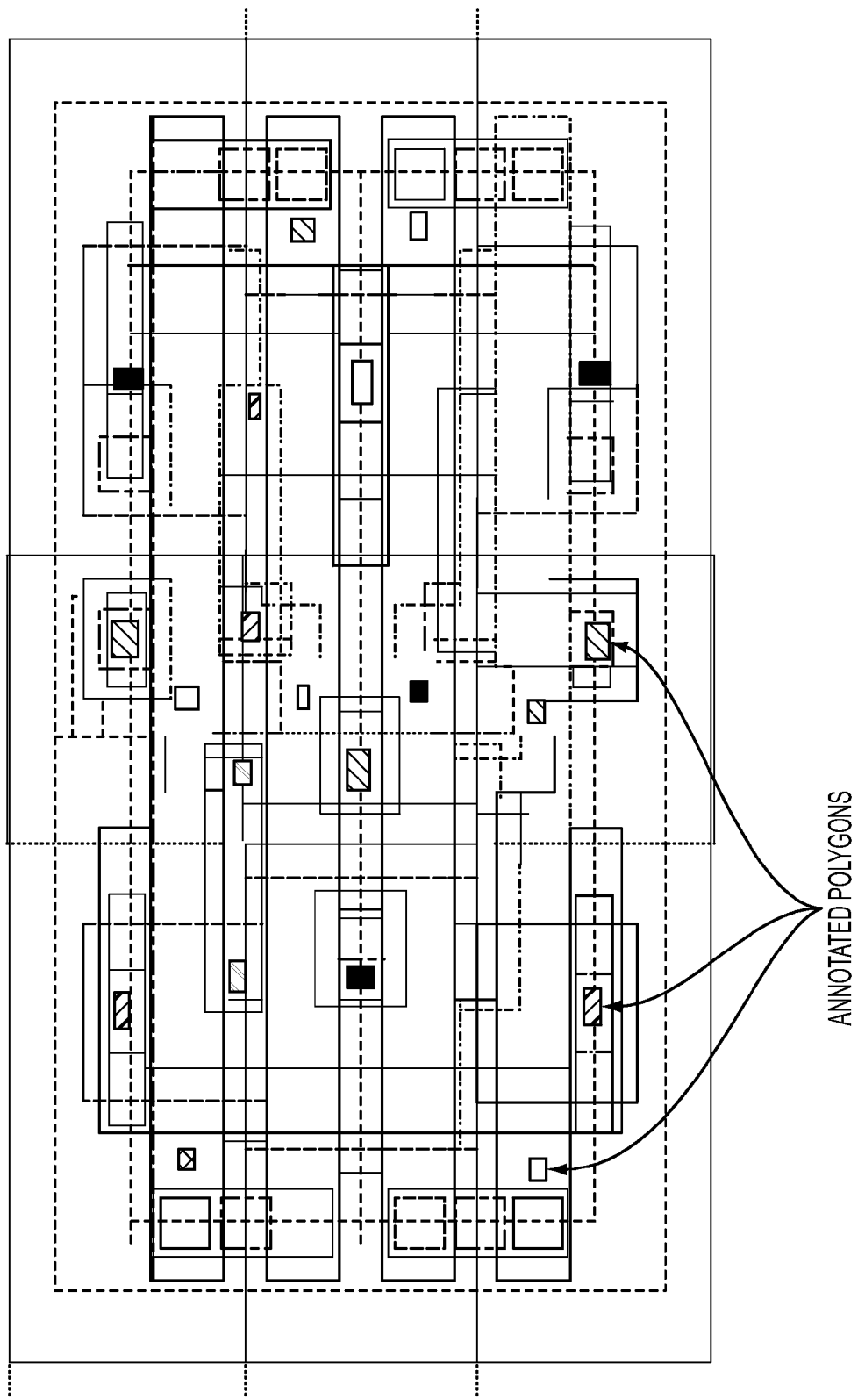
FIG. 2 is an exemplary design layout in a graphic format that illustrates annotated polygons according to an embodiment of the present disclosure.

Layout annotation is thus performed using layout-level annotated contact. The annotations can be added in a text format identifying the functional component of a device. In one embodiment, a suitable layout editor known in the art, such as Sentaurus Ligament™, can be employed to explicitly specify the locations of each contact element at the layer levels at which the contact element occurs in the design layout. If the device is a field effect transistor, the text for identifying the functional component can be, for example, "source," "drain," "gate," etc. For example, if a design layout includes static random access memory (SRAM) bitcells as illustrated in FIG. 2, labels such as "VDD" and "GND" representing a positive power supply node and an electrical ground node, respectively, can be designated using small polygons, which become annotated polygons attached to the respective layers upon annotation with the labels.

In one embodiment, step 100 can be automated by a system including annotating means for automatically annotating a design layout by adding annotations identifying functional components of at least one device to contact elements on design shapes corresponding to the functional components in the design layout. The annotating means can be any computer or computing device configured to run a program for automatically annotating the design layout. The program for automatically annotating the design layout can be stored in a non-transitory machine readable data storage medium as known in the art. The non-transitory machine readable data storage medium embodies an automated program for manipulating the design layout employing the methods of the present disclosure.

Referring to step 200 of FIG. 1, a set of process assumptions are provided for the technology node of the design layout. The set of process assumptions include various dimensions of structures in each level such as the thickness and tolerances of each layer in a gate stack, the thickness of each dielectric layer, the thickness of each conductive layer, the depth and dopant concentration profile of each ion implantation, the etch bias, and other processing parameters employed during a manufacturing process to form physical structures corresponding to the design layout. Step 200 can be performed after performing step 100, after performing step 100, or concurrently with step 100.

Three-dimensional (3D) structures are generated for the set of process assumptions to provide a database for device structures. In one embodiment, the generation of the 3D structures can be performed employing a program code such as Sentaurus Structure Editor™, which is a structure generation tool (program) from an electronic design automation (EDA) vendor. In another embodiment, the device structures for the device database can be generated from process simulations employing a program code such as Sentaurus Process™, which is a process simulation tool (program) from an EDA vendor.

The device structures in the database can include structures for any type of semiconductor devices. In one embodiment, the device structures can include field effect transistors, and the database for device structures is constructed to include a field effect transistor (FET) database. As used herein, a transistor can be any of a planar field effect transistor, a nonplanar field effect transistor such as a fin field effect transistor (finFET), a tri-gate field effect transistor, a dual gate field effect transistor, or an annular gate field effect transistor, a junction field effect transistor such as a bipolar junction transistor, or any field effect transistor based on a carbon nanotube or any other semiconducting material known in the art or to be discovered in the future. In one embodiment, the FET database can be constructed as a database amenable to various operations of technology computer aided design (TCAD) programs, i.e., as a TCAD-friendly FET database. In another embodiment, the FET database can be generated for various process corners of the concerned devices and/or various threshold voltage options for the concerned devices in the technology.

If a TCAD-friendly FET database is constructed, a large number of process simulated single device FET structures can be constructed as structure files, which are herein referred to as "FET structure files." In one embodiment, a large number of process simulated device FET structures can be constructed with high-resolution details in the device regions (such as the channel region) where device-performance-affecting phenomena occur. The FET structure files can be generated once per set of process assumptions at a given technology node and stored (or cached) in the device database (DD).

In one embodiment, the FET database can be constructed to include corresponding finite element meshes for field effect transistor structures in the technology node. In one embodiment, the field effect transistor structures can be constructed from the design layout previously annotated or to be annotated for structure file generation. In another embodiment, the field effect transistor structures can be constructed from any other design layout in the same technology node.

Figure 3:
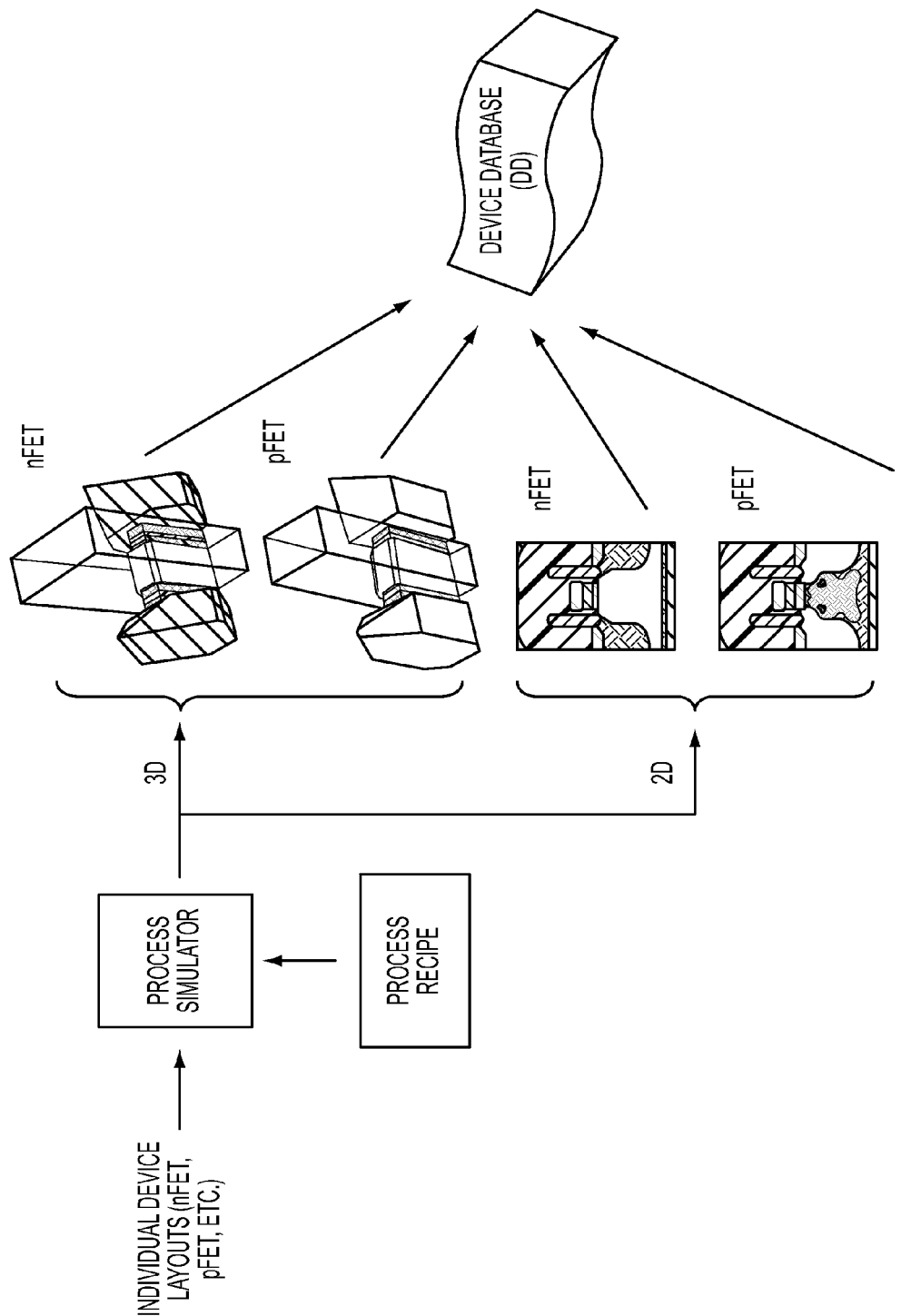
FIG. 3 is an illustration of two-dimensional and three-dimensional process simulated single device FET structures according to an embodiment of the present disclosure.

Exemplary two-dimensional and three-dimensional process simulated single device FET structures are illustrated in FIG. 3.

Referring to step 300 of FIG. 1, a structure file is generated from the annotated design layout provided at step 100, the device database provided at step 200 and a set of process assumptions for FEOL/BEOL regions outside the FET regions. The generation of the structure file can be automatically performed employing an automated system such as a computer or a computing device configured to run a program. The program for generating the structure file is herein referred to as a full structure generator.

Figure 4:
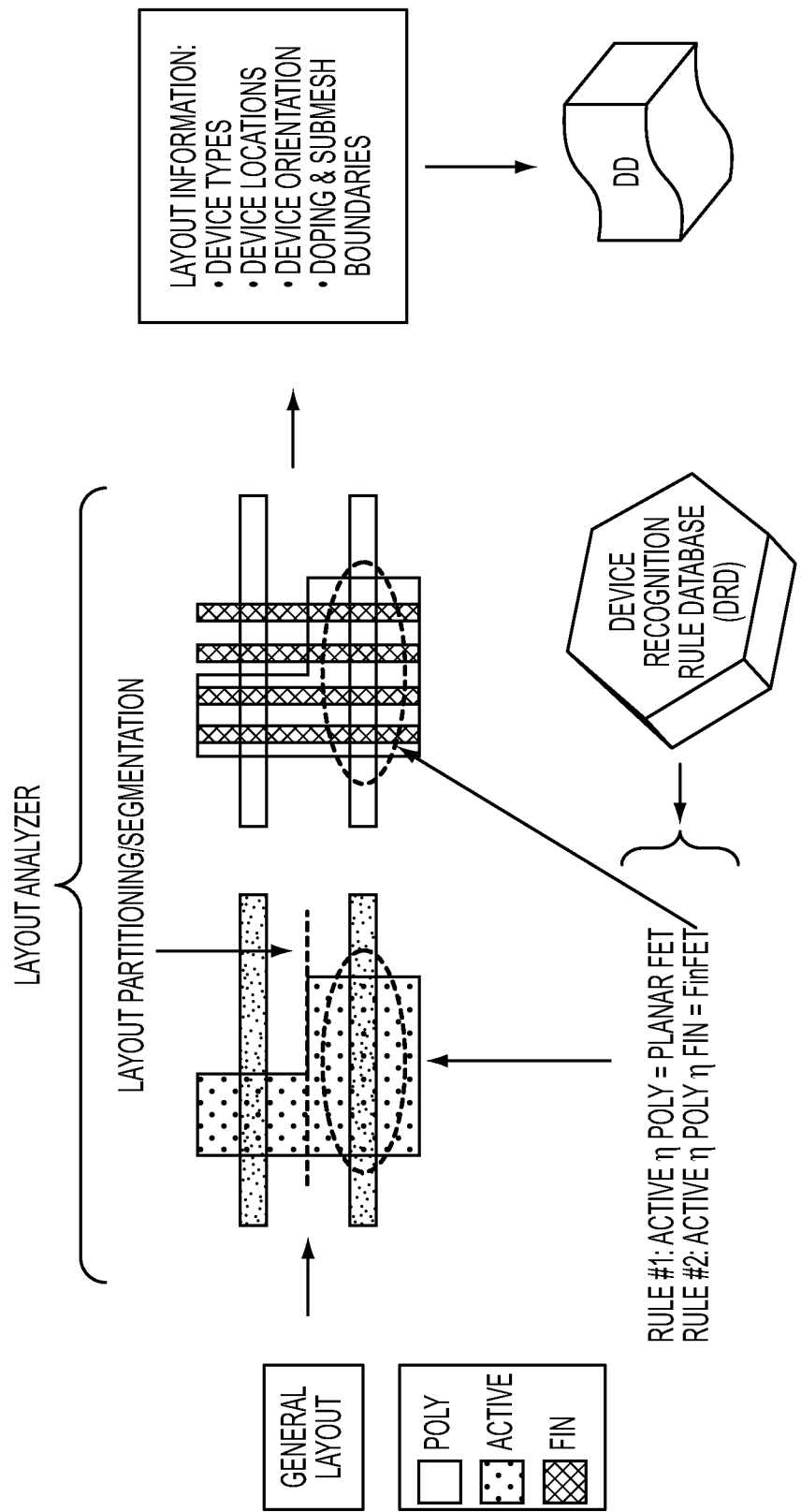
FIG. 4 is a diagram illustrating the step of layout analysis according to an embodiment of the present disclosure.

In order to generate the structure file, the annotated design layout is first analyzed. FIG. 4 illustrates the step of layout analysis, in which the annotated design layout that is provided as the input layout is analyzed to detect various physical characteristics of the devices therein. For example, the various physical characteristics of the devices can include location of the devices, orientations of the devices, doping boundaries of the devices, and sub-mesh boundaries of the devices. In one embodiment, the devices can include field effect transistor. The information on the various physical characteristics of the devices can be indexed and stored in a database, which can be provided in the same computer that runs a program for analyzing the annotated design layout or can be provided as a separate database (DD). This information can be gathered for each device within the annotated design layout. A layout analyzer program can be employed to analyze the annotated design layout and to gather information therefrom.

Referring to FIG. 4, operation of an exemplary layout analyzer program is illustrated for a design layout including field effect transistors. The layer "ACTIVE" represents active regions in the design layout, the layer "POLY" represents a polysilicon conductor (PC) layer, and the layer "FIN" represents semiconductor fins in the design layout. A device recognition rule database (DRD) can provide rules for recognizing each device. For example, the existence of a non-zero area for the union of an area labeled (annotated) "ACTIVE" and an area labeled "POLY" without an overlap with any area labeled "FIN" can provide the information that a planar FET is present, and the existence of a non-zero area for the union of an area labeled (annotated) "ACTIVE" and an area labeled "POLY" and an area labeled "FIN" can provide the information that a finFET is present.

Figure 5:
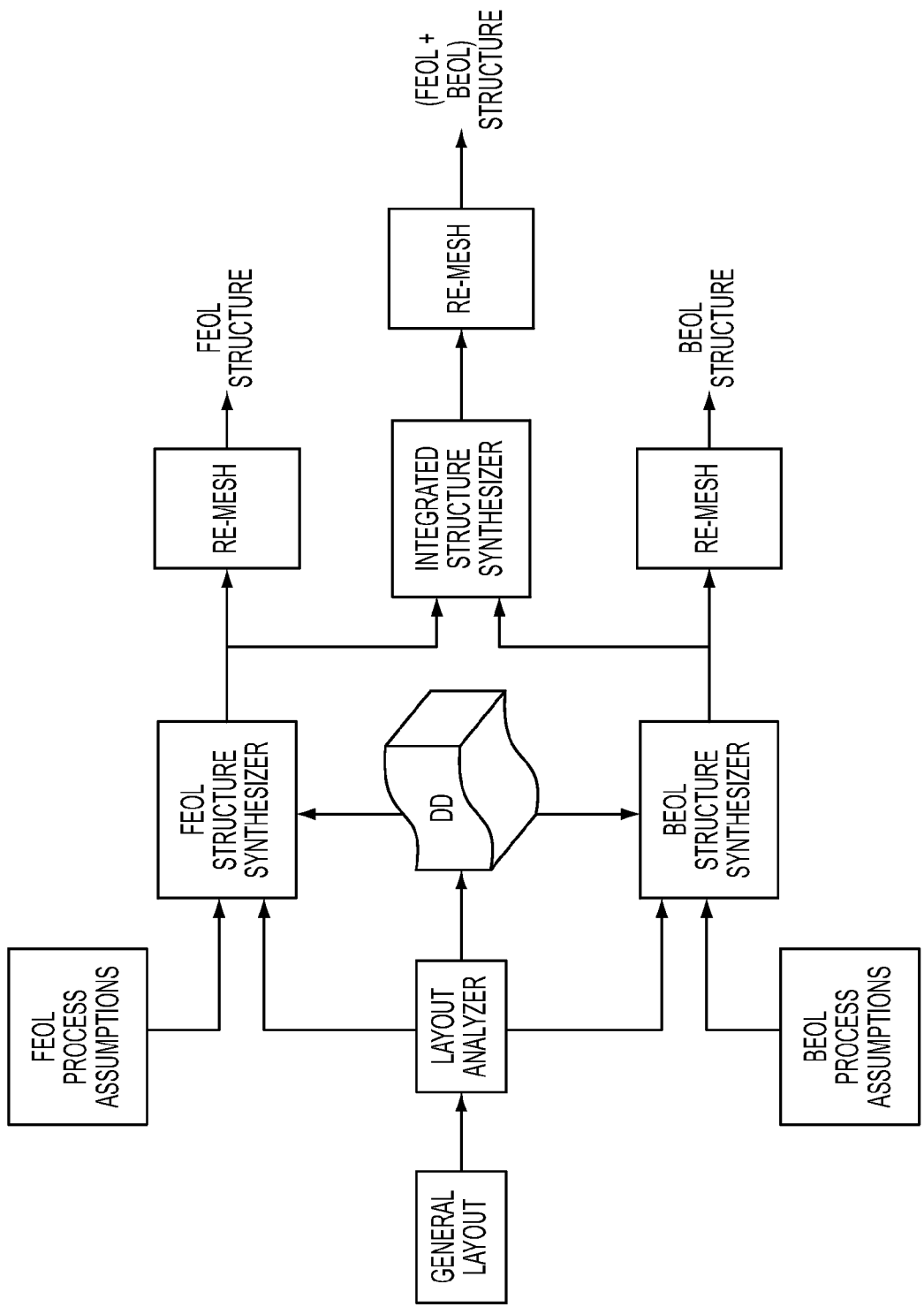
FIG. 5 is a flow chart illustrating various steps within step 300 of FIG. 1 according to an embodiment of the present disclosure.

The layout analyzer program can employ an algorithm that extracts information from an annotated design layout. An example of such an algorithm is listed below:

Exemplary Algorithm 1: Construction of FET Database
RL←Read_Layout( ):
For Field in RL do
   if Field is 'Vertices' then
     V←Read_Vertices( );
   else if Field is 'Polygons' then
     P←Read_Polygons( );
   else if Field is 'Regions' then
     Layers←Read_Layers( );
     Declare_Contacts (Layers, LLACs);
   end
end
for Polygon in P do
   if Polygon. Type is 'Contact' then
     Compute_Contact_Placement( );
   end
     Remove_Polygon_Duplication(Polygon);
     Assign_Global_Bounding_Box( );
     Compute_Masks(Polygon=RX, PC, CA, M1, V1, M2, V2, M3);
end
for Poly1 in PC.Polygon do
   for Poly2 in RX.Polygon do
     CP←Polygon_Intersect(Poly1, Poly2);
     if CP is valid FET then
       FETs(Type, Location, Extrusion, Gatelength)
         ←Compute_FET(CP);
       FETDB.append(FET);
     end
   end
end Referring to FIG. 5, a flow chart illustrates various steps within step 300 of FIG. 1 including the layout analysis step. Once the layout analysis is performed, a structure file representing a three-dimensional representation of the at least one device including finite element meshes (FEMs) is automatically constructed based on the annotated design layout and the information extracted by the layout analyzer program. During the automated structure synthesis, codes representing front-end-of-line (FEOL) structures, back-end-of-line (BEOL), and (FEOL+BEOL) structures are generated. The program that automatically performs step 300 can automatically generate the codes, which are various types of structure files. These structure files depend on the specific design layout that is provided for annotation at step 100, and the set of process assumptions for the technology node in which the design layout is designed, and the specific types of devices used in the layout which are present in the database DD. This portion of the automated program is herein referred to as a structure synthesizer. It is noted that several variations of the flow chart of FIG. 5 are possible by combining or omitting various steps represented as blocks in FIG. 5.

A FEOL structure file for the entire annotated design layout can be generated employing an algorithm, an example of which is listed below:

Exemplary Algorithm 2: FEOL structure file generation pseudo-code

```
Set_Default_Body_Overlap_Behavior(New replaces Old);
For FET in FETDB do
   Clear_Workspace( );
   Cubes←Create_RX_Cubiods( );
   RXMask←Build_RX_Mask(FET.RX);
   LongFET←Chop_Domain(RXMask, Cubes);
   FET.long←Save_Part(LongFET);
   Clear_Workspace( );
   ShortFET←Load_TDRstem(FET);
   Add_Materials(ShortFET);
   ShortFETex←Extrude_FET(ShortFET, FET.Extrusion);
   RotatedFET←Rotate_FETex(ShortFETex,   Axisangle,
      AxisVector);
   TranslatedFET←Translate_FETrot(RotatedFET,  Axis-
      Displacement);
   ChoppedFET←Chop_Domain(RXMask,   Translated-
      FET);
   FinalFET←Body_Trim(ChoppedFET, BottomOxideDepth);
   FET.short←Save_Part(FinalFET)
End
Clear_Workspace( );
Set_Default_Body_Overlap_Behavior(New replacesOld);
For FET in FETDB do
   MergLongFET←Load(MergeLongFET, FET.long);
End
Clear_Workspace( );
For FET in FETDB do
   MergeShortFET←Load(MergeShortFET, FET.short);
End
Clear_Workspace( );
Set_Default_Body_Overlap_Behavior(New replaces Old);
FEOL_FETs←Load(MergeLongFET, MergeShortFET);
FEOL_Lumped←Separate_Lumps (FEOL_FETs);
FEOL←Save_Part(FEOL_Lumped);
```

An exemplary implementation of the FEOL generation algorithm for a planar process integration scheme is illustrated in FIGS. 6A-6C, 7A-7D, and 8A-8H.

Figure 6A:
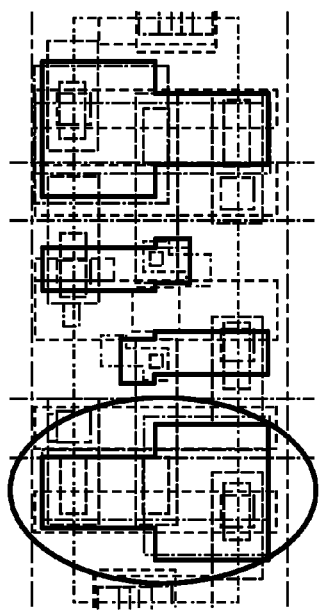
FIG. 6A is an illustration of an annotated design layout according to an embodiment of the present disclosure.

Referring to FIG. 6A, an annotated six transistor static random access memory (SRAM) design bitcell layout is shown. Annotated polygons are not expressly shown in FIG. 6. The area marked by an ellipse includes two n-type field effect transistors. The automated program can construct various intermediate FEOL structure files by sequentially extracting, layer by layer, three-dimensional shapes for each element representing a physical volume in a physical semiconductor device from the annotated design layout. For example, the three-dimensional shapes can represent a volume of an active area of a semiconductor device and volumes of various layers overlying the active area. The automated program can identify a functional device in the annotated design layout. The automated program can detect the presence of intersections of RX level design shapes and PC level design shapes within the ellipse of FIG. 6A, and identify all the field effect transistors within the ellipse.

Figure 6C:
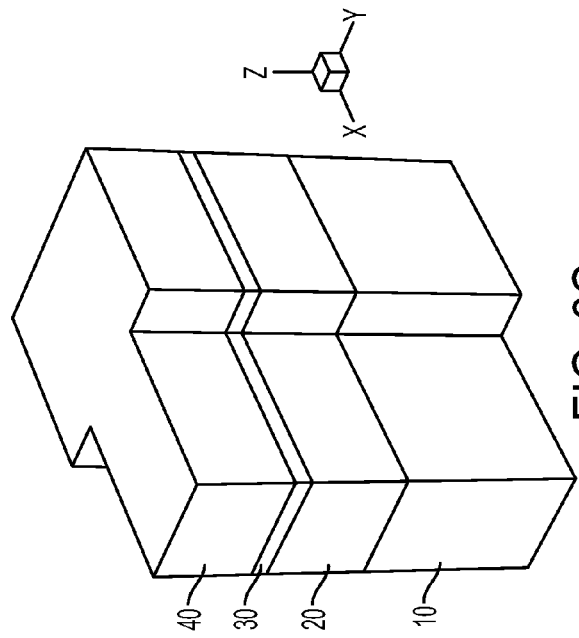
FIG. 6C is a graphic representation of a second longFET-style intermediate FEOL structure file generated from the first longFET-style intermediate FEOL structure file by defining a contiguous active area region within the annotated design layout according to an embodiment of the present disclosure.
Figure 6B:
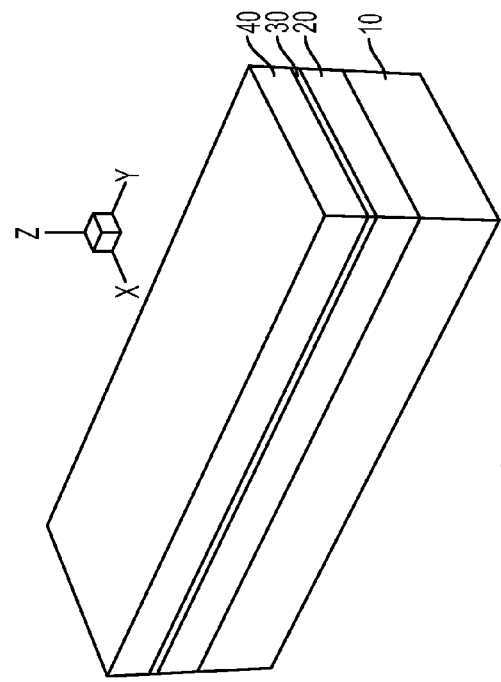
FIG. 6B is a graphic representation of a first longFET-style intermediate front-end-of-line (FEOL) structure file generated from the annotated design layout according to an embodiment of the present disclosure.

Referring to FIG. 6B, a first longFET-style intermediate front-end-of-line (FEOL) structure file is generated from the annotated design layout. As used herein, a "longFET-style" structure file refers to a structure file generated to include three-dimensional geometrical features of a region including all active area(s) of at least one field effect transistor (FET). A longFET is a set of data representing a field effect transistor, and is only geometry-accurate, i.e., it accurately captures overall dimensions, and does not provide process simulation level accuracy. The longFET is needed to capture the exact shape in which the active region is patterned. A longFET is also referred to as an extended-geometry-accurate zone (EGAZ). As used herein, an "FEOL" structure file refers to a structure file that represents the geometry of semiconductor structures that are formed prior to formation of contact via structures.

The first longFET-style intermediate FEOL structure file can be generated by generating codes for three-dimensional structures representing stacks of blanket layers that are present in a physical semiconductor structure by default in the absence of any additional design shapes in the design layout. For example, the first longFET-style intermediate FEOL structure file can include codes for a rectangular stack, from bottom to top, of a buried insulator layer 10 of a semiconductor-on-insulator (SOI) substrate, a silicon layer 20, a silicide layer 30, and a contact-level dielectric material layer 40 that includes a dielectric material such as silicon nitride, silicon oxide, and/or organosilicate glass (OSG).

Referring to FIG. 6C, a second longFET-style intermediate FEOL structure file is generated from the first longFET-style intermediate FEOL structure file and the annotated design layout by defining a contiguous active area region within the annotated design layout. The automated program can construct the second longFET-style intermediate FEOL structure files by sequentially extracting a three-dimensional shape for an active area, such as the active area identified by an ellipse, from the annotated design layout of FIG. 6A. The lateral extent of the first longFET-style intermediate FEOL structure file is limited by the lateral extent of the active area identified by the ellipse of FIG. 6A to generate the second longFET-style intermediate FEOL structure file.

Figure 7A:
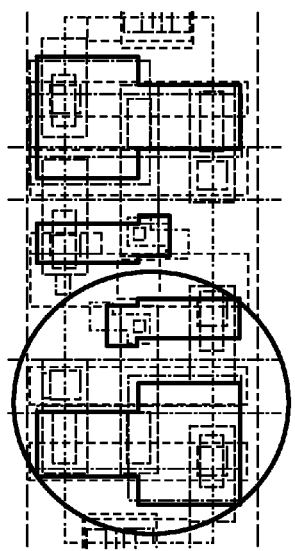
FIG. 7A is an illustration of the annotated design layout of FIG. 6A.

Referring to FIG. 7A, the connectivity of a functional device to at least another functional device can be extracted from the annotated design layout. For example, the connectivity of a p-type field effect transistor to two n-type field effect transistors within the active area in the ellipse of FIG. 6A is extracted from the annotated design layout. As indicated by the ellipse in FIG. 7A, two active areas having connectivity at a circuit level are identified in the annotated design layout.

Figure 7B:
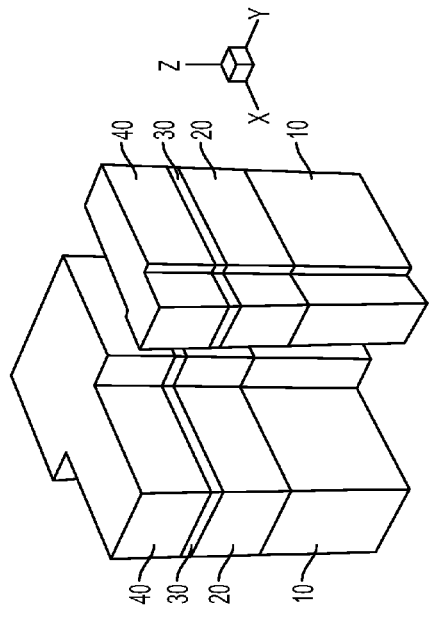
FIG. 7B is a graphic representation of a third longFET-style intermediate FEOL structure file generated from the second longFET-style intermediate FEOL structure file and the annotated design layout according to an embodiment of the present disclosure.

Referring to FIG. 7B, a third longFET-style intermediate FEOL structure file can be generated from the second longFET-style intermediate FEOL structure file and the annotated design layout. A set of three-dimensional shapes is generated from the additional active area having connectivity at the circuit level as identified in FIG. 7A. The third longFET-style intermediate FEOL structure file is generated from the second longFET-style intermediate FEOL structure file and the annotated design layout by adding three-dimensional structures corresponding to another contiguous active area region within the annotated design layout and a stack of layers thereupon. The automated program can construct the third longFET-style intermediate FEOL structure files by extracting additional three-dimensional shapes derived from another active area having connectivity to the active area identified in FIG. 6A from the annotated design layout. The lateral extent of the second longFET-style intermediate FEOL structure file is expanded by the lateral extent of the additional active area added in the ellipse of FIG. 7A relative to the ellipse of FIG. 6A to generate the third longFET-style intermediate FEOL structure file.

Figure 7C:
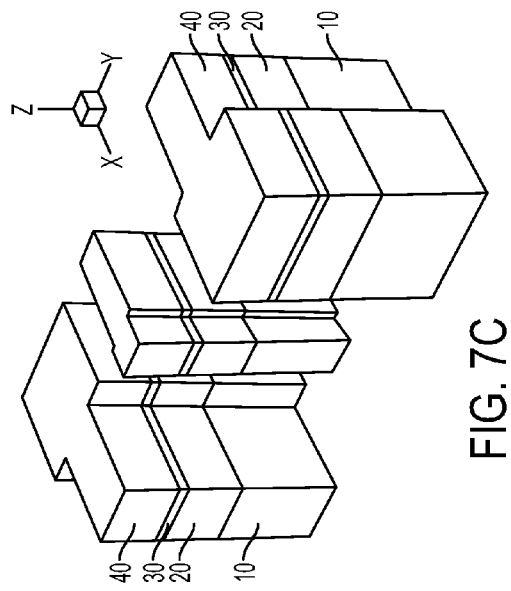
FIG. 7C is a graphic representation of a fourth longFET-style intermediate FEOL structure file generated from the third longFET-style intermediate FEOL structure file and the annotated design layout according to an embodiment of the present disclosure.

Referring to FIG. 7C, a fourth longFET-style intermediate FEOL structure file is generated from the third longFET-style intermediate FEOL structure file and the annotated design layout by identifying another active area having connectivity to the two active regions identified in FIG. 7A. Another set of three-dimensional shapes is generated from the newly added active area having connectivity to the two active areas within the ellipse of FIG. 7A. The fourth longFET-style intermediate FEOL structure file is generated from the third longFET-style intermediate FEOL structure file and the annotated design layout by adding three-dimensional structures corresponding to the newly added contiguous active area region within the annotated design layout and a stack of layers thereupon. The automated program can construct the fourth longFET-style intermediate FEOL structure files by extracting additional three-dimensional shapes derived from the newly added active area having connectivity to the active areas identified in FIG. 7A from the annotated design layout. The lateral extent of the third longFET-style intermediate FEOL structure file is expanded by the lateral extent of the additional active area to generate the fourth longFET-style intermediate FEOL structure file.

In general, by continuing to expand the set of active area based on circuit level connectivity, a device circuit region including a functional device (such as a field effect transistor) and additional functional devices (such as additional field effect transistors) having connectivity to the functional circuit are identified. Three-dimensional device structures corresponding to each functional device are sequentially incorporated within the device circuit region. The three-dimensional device structures can include three-dimensional structures representing field effect transistors.

Figure 7D:
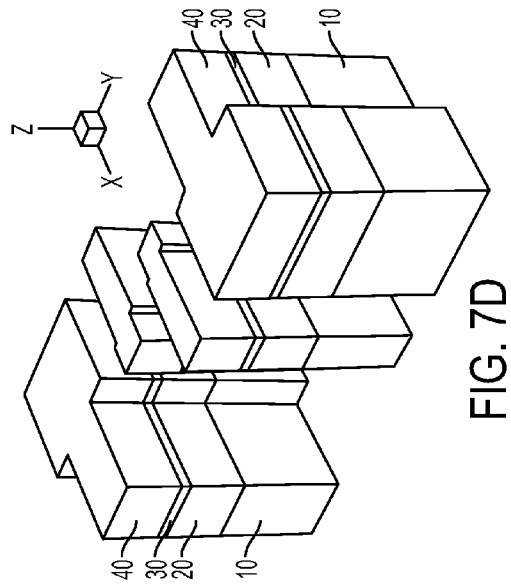
FIG. 7D is a graphic representation of a fifth longFET-style intermediate FEOL structure file generated from the fourth longFET-style intermediate FEOL structure file and the annotated design layout according to an embodiment of the present disclosure.

Referring to FIG. 7D, a fifth longFET-style intermediate FEOL structure file can be generated from the fourth long-FET-style intermediate FEOL structure file and the annotated design layout. The fifth longFET-style intermediate FEOL structure file represents four active areas for a six transistor SRAM cell and overlying three-dimensional structures up to a contact level in which contact via structures to sources, drains, and gates are present in physical semiconductor device structures.

Figure 8A:
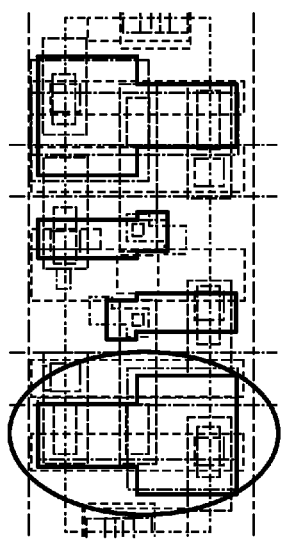
FIG. 8A is an illustration of the annotated design layout of FIGS. 6A and 7A.
Figure 8B:
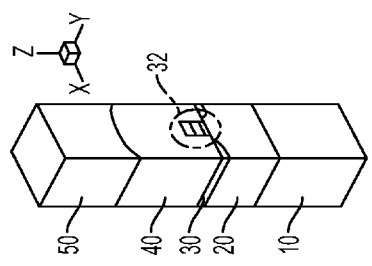
FIG. 8B is a graphic representation of a first shortFET-style intermediate FEOL structure file generated from the annotated design layout according to an embodiment of the present disclosure.

Referring to FIG. 8A, a field effect transistor within an ellipse is selected. Referring to FIG. 8B, a first shortFET-style intermediate front-end-of-line (FEOL) structure file is generated from the selected field effect transistor in the annotated design layout. As used herein, a "shortFET-style" structure file refers to a structure file generated to include three-dimensional geometrical features of a region at which an active area intersects a gate conductor of at least one field effect transistor (FET). The first shortFET-style intermediate FEOL structure file includes three-dimensional structures that illustrate detailed features of a gate dielectric, a source-to-body junction, a drain-to-body junction, and other features of a gate conductor that can influence performance of the field effect transistor such as side wall profiles of the gate conductor.

A shortFET is a set of data representing features of a field effect transistor, and has process simulation level accuracy as obtained from 2D/3D process simulation. Hence, all doping profiles/vertical geometries in a shortFET are process-accurate, preserving the necessary detail where needed. A shortFET may, or may not, coincide with a single FET. In some cases, a shortFET it can be a region of FETs as well, e.g., matched transistors or regions where process-level accuracy is needed in regions between FETs as well.

The intersection of a longFET and a shortFET yields a structure which is process-accurate in the shortFET region, with doping profiles extruded, e.g., according to a rule/equation adopted by a process modeling engineer, in the remainder of the longFET. The longFET is needed to capture the exact shape in which the active region is patterned. The separation of the shortFET and the longFET is key to structure synthesis. This separation enables creation of a shortFET database for all process corners, such as threshold voltage values, from which FETs can be intelligently absorbed into the longFETs. Further, this separation maintains the delicate balance between preserving geometric accuracy throughout the structure and process accuracy only in regions where required, without having to perform 3D-process simulation of the entire layout over and over again for different process corners, etc.

The scope of the shortFET is chosen carefully such that device transport is relatively unaffected by the automated layout design system (ALDS) approximation of splitting the structure into shortFETs and longFETs. A shortFET is also referred to as a process-accurate zone (PAZ).

The first shortFET-style intermediate FEOL structure file can be generated by generating codes for three-dimensional structures representing various elements that are present in the gate stack of a gate dielectric and at least one gate conductor portion and in the p-n junctions around the channel of the field effect transistor. For example, the first shortFET-style intermediate FEOL structure file can include codes for a rectangular stack, from bottom to top, of a buried insulator layer 10 of a semiconductor-on-insulator (SOI) substrate, a silicon layer 20, a gate dielectric layer 30, a contact-level dielectric material layer 40, and a gate and channel region 32 that includes a gate stack and p-n junctions around a channel of a field effect transistor and embedded within the silicon layer 20, the gate dielectric layer 30, and the contact-level dielectric material layer 40.

The generation of the first shortFET-style intermediate FEOL structure file can be performed, for example, by importing a matching field effect transistor structure from the database into a blank file upon detection of a match between geometry of the selected field effect transistor and the field effect transistor structures in the database.

In one embodiment, an automated program can extract, layer by layer, a three-dimensional shape for each element representing a physical volume in a physical semiconductor device from the annotated design layout to construct the first shortFET-style intermediate FEOL structure file. Non-limiting examples of volumes that a three-dimensional shape can represent include a volume of an active area of a semiconductor device, a volume occupied by a gate dielectric, a volume occupied by a gate electrode, a volume occupied by a source region or a drain region, a volume occupied by a metal semiconductor alloy, and a volume occupied by a dielectric gate spacer.

Figure 8C:
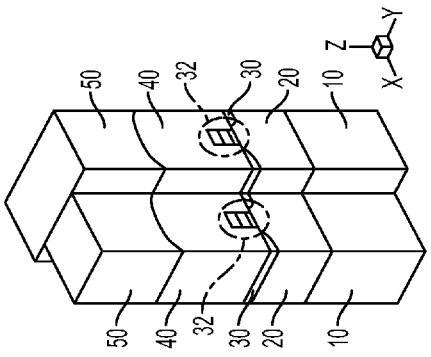
FIG. 8C is a graphic representation of a second shortFET-style intermediate FEOL structure file generated from the first shortFET-style intermediate FEOL structure file and the annotated design layout according to an embodiment of the present disclosure.
Figure 8D:
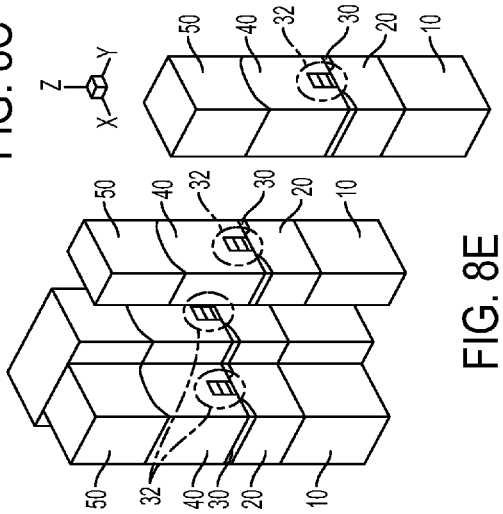
FIG. 8D is a graphic representation of a third shortFET-style intermediate FEOL structure file generated from the second shortFET-style intermediate FEOL structure file and the annotated design layout according to an embodiment of the present disclosure.
Figure 8E:
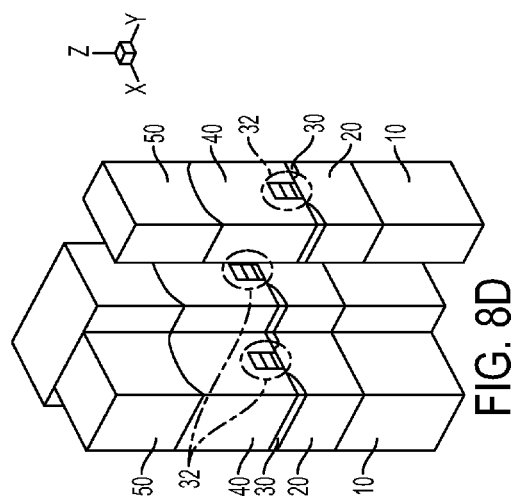
FIG. 8E is a graphic representation of a graphic representation of a fourth shortFET-style intermediate FEOL structure file generated from the third shortFET-style intermediate FEOL structure file and the annotated design layout according to an embodiment of the present disclosure.

Referring to FIG. 8C, a second shortFET-style intermediate FEOL structure file is generated from the first shortFET-style intermediate FEOL structure file and the annotated design layout by adding three-dimensional structures representing various elements that are present in the gate stack of another field effect transistor and in the p-n junctions around the channel of that field effect transistor. The body regions and shared source/drain regions that are common to the two field effect transistors are merged. Further, overlapping or adjoining three-dimensional shapes above the merged shape for the active areas are also merged.

Referring to FIGS. 8D-8G, third, fourth, fifth, and sixth shortFET-style intermediate FEOL structure files are generated from an additional selected field effect transistor in the annotated design layout and the second, third, fourth, or fifth shortFET-style intermediate FEOL structure file, respectively, i.e., the immediately preceding shortFET-style intermediate FEOL structure file. Each of the third, fourth, fifth, and sixth shortFET-style intermediate FEOL structure files incorporates additional three-dimensional structures corresponding to the newly added field effect transistor.

Each of the third, fourth, fifth, and sixth shortFET-style intermediate FEOL structure files can be generated by generating codes for three-dimensional structures representing various elements that are present in the gate stack of a gate dielectric and at least one gate conductor portion and in the p-n junctions around the channel of the field effect transistor. Each shortFET-style intermediate FEOL structure file can include codes for a plurality of rectangular stacks, from bottom to top, of a buried insulator layer 10 of a semiconductor-on-insulator (SOI) substrate, a silicon layer 20, a gate dielectric layer 30, a contact-level dielectric material layer 40, and a gate and channel region 32 that includes a gate stack and p-n junctions around a channel of a field effect transistor and embedded within the silicon layer 20, the gate dielectric layer 30, and the contact-level dielectric material layer 40.

The generation of the each shortFET-style intermediate FEOL structure file can be performed, for example, by importing a matching field effect transistor structure from the database into a blank file upon detection of a match between geometry of the selected field effect transistor and the field effect transistor structures in the database.

In one embodiment, an automated program can extract, layer by layer, a three-dimensional shape for each element representing a physical volume in a physical semiconductor device from the annotated design layout to construct each modification on a prior shortFET-style intermediate FEOL structure file. Non-limiting examples of volumes that a three-dimensional shape can represent include a volume of an active area of a semiconductor device, a volume occupied by a gate dielectric, a volume occupied by a gate electrode, a volume occupied by a source region or a drain region, a volume occupied by a metal semiconductor alloy, and a volume occupied by a dielectric gate spacer.

Referring to FIG. 8H, a FEOL structure file can be generated by merging the sixth shortFET-style intermediate FEOL structure file, which is the last shortFET-style intermediate FEOL structure file, and the fifth longFET-style intermediate FEOL structure file of FIG. 7C, which is the last longFET-style intermediate FEOL structure file. Merging the last shortFET-style intermediate FEOL structure file and the last longFET-style intermediate FEOL structure file provides a FEOL boundary representation and exact shapes of active areas of field effect transistors.

Referring to FIG. 5, FEOL finite element meshes (FEOL FEMs) can be built into the FEOL structure file when the FEOL structure file is generated. Alternately, the FEOL FEMs can be re-meshed to generate the FEOL structure file. If the FEOL FEMs are not present, new FEOL FEMs can be added to the FEOL structure file.

A back-end-of-line (BEOL) structure file can be generated from the annotated design layout concurrently with, after, or prior to generating the FEOL structure file. As used herein, a "BEOL" structure file refers to a structure file that represents the geometry of metal interconnect structures that are formed after formation of contact via structures. A BEOL structure file can be generated employing an algorithm, an example of which is listed below:

Exemplary Algorithm 3: BEOL structure file generation pseudo-code
Set_Default_Body_Overlap_Behavior(New replaces old);
for L in Layers do
  if L is 'RX' or 'CAALL' or 'PC' then
    continue;
  else
    ILDbody←Creat_ILD_Cuboids(ILDbody, Bounding_Box, L);
  end
end
for Poly 1 in P do
if Poly 1.Type is 'RX' then
  continue
else
  Polysheet←Create_Polygonal_Sheet(Poly1);
  Polybody←Sweep_Sheet(Polysheet, SweepVector, SweepDraftAngle);
  ILDbody←Translate_Into(ILDbody, Polybody, Poly1.Type);
end
end
BEOL_Lumped←Separate_Lumps(ILDbody);
BEOL←Save_Part(BEOL_Lumped);

FIGS. 9A-9F provide a graphic representation of the process of generating the BEOL structure file. Referring to FIG. 9A, a first intermediate BEOL structure file is generated from the annotated design layout. The first intermediate BEOL structure file includes a three dimensional structure of a first interlayer dielectric cuboid 61 representing a first dielectric material layer in a physical metal interconnect structure. For example, the first interlayer dielectric cuboid 61 can represent a capping layer over a contact-level dielectric material layer or a first BEOL dielectric layer that embeds first metal level (M1) metal lines. The area of the cuboid 61 can be the same as the area of the annotated design layout of FIG. 6A, FIG. 7A, or FIG. 8A.

Referring to FIG. 9B, a second intermediate BEOL structure file is generated from the first intermediate BEOL structure file and the annotated design layout by adding a second interlayer dielectric cuboid 62, which represents a second dielectric material layer in the physical metal interconnect structure.

Referring to FIG. 9C, a third intermediate BEOL structure file is generated from the second intermediate BEOL structure file and the annotated design layout by adding additional interlayer dielectric cuboids (63, 64, 65, 66, 67, 68, 69, 70), which represent additional interlayer dielectric material layer above the second interlayer dielectric material layer in the physical metal interconnect structure.

Referring to FIG. 9D, a fourth intermediate BEOL structure file is generated from the third intermediate BEOL structure file and the annotated design layout by extracting three dimensional shapes 74 for a metallic line structure in selected BEOL design layer, which can be a metal line level design layer or a metallic via structure in a metal via level design layer. The three dimensional shapes 74 are placed within the corresponding metal line level or metal via level within the fourth intermediate BEOL structure file. For example, the selected BEOL design layer can be a bottommost metal interconnect level in BEOL such as contact array (CA) level or first metal line (M1) level.

Referring to FIG. 9E, a fifth intermediate BEOL structure file is generated from the fourth intermediate BEOL structure file and the annotated design layout by extracting, layer by layer, a three-dimensional shape for each element representing a physical volume in a metal interconnect structure from the annotated design layout. Each three-dimensional shape can represent a volume of a metallic line structure, a volume of a metallic via structure, a volume of an integrated line and via structure, or a volume of a metallic contact pad structure.

Referring to FIG. 9F, another view of the fifth BEOL structure is shown, in which the interlayer dielectric material layers (ILDS) is turned off for the purpose of clearly illustrating the interconnection of the metal interconnect structures embedded within the ILDS. The fifth intermediate BEOL structure can be employed as the BEOL structure file.

Referring to FIG. 5, the BEOL FEMs can be re-meshed to generate the BEOL structure file. If the BEOL FEMs are not present, new BEOL FEMs can be added to the FEOL structure file.

The FEOL structure file or the BEOL structure file can be employed for performing device simulation. Alternately, the FEOL structure file and the BEOL structure file can be merged to generate another structure file, which is herein referred to as an integrated structure file. The integrated structure file can be generated employing an algorithm, an example of which is listed below:

Exemplary algorithm 4: Integrated structure generation pseudo-code:
Set_Default_Body_Overlap_Behavior(New replaces Old);
Create_CAALL_Cuboids( );
Create_SOI_Cuboid( );
Load(FEOL);
Fix_imprints( );
Load(BEOL);
Fix_imprints( );
Place_Contacts( );
for FET in FETDB do
   Ref←Compute_Submesh_Refinement_Window(FET);
   Place_Submesh(Ref);
end
Refine_Mesh( );
Build_Mesh( );

Referring to FIG. 10A, a combination of the FEOL structure file and the BEOL structure file is schematically illustrated. FIG. 10B illustrates a portion of the FEOL structure file, i.e., a portion including source, drain, and channel regions of the six field effect transistors of an SRAM cell. The dopant profile and the submeshes from individual shortFETs incorporated in the processing steps corresponding to FIGS. 8B-8G are illustrated in FIG. 10B. For illustrative purposes, semiconducting regions are classified into five dopant concentration ranges having different dopant concentration type and/or ranges. The six numbers in legends represent the boundaries of the five dopant concentration ranges. Positive numbers correspond to p-type doping, and negative numbers correspond to n-type doping.

Referring to FIG. 10C, the FEOL structure file and the BEOL structure file are integrated, i.e., merged, with contacts and finite element meshes (FEMS) to generate a structure file, i.e., an integrated structure file. Refinement windows for dopant profile and/or submeshes can be generated. Further, device contact placement can be determined at this step. For illustrative purposes, semiconducting regions are classified into five dopant concentration ranges having different dopant concentration type and/or ranges. The six numbers in legends represent the boundaries of the five dopant concentration ranges. Positive numbers correspond to p-type doping, and negative numbers correspond to n-type doping.

Referring back to FIG. 1, step 300 can be automated by a system including structure-file-generating means for automatically generating a structure file from the annotated design layout employing an automated program. The structure-file-generating means can be any computer or computing device configured to run a program for automatically generating a structure file from the annotated design layout. The annotating means and the structure-file-generating means can be two separate computers/computing devices or a same computer/computing device. The program for automatically generating a structure file can be stored in a non-transitory machine readable data storage medium as known in the art. The non-transitory machine readable data storage medium embodies an automated program for manipulating the design layout employing the methods of the present disclosure. The program for automatically annotating a design layout and the program for automatically generating a structure file can be stored in the same non-transitory machine readable data storage medium or in a set of plurality of non-transitory machine readable data storage media, which is herein collectively referred to as a non-transitory machine readable data storage medium.

The structure file generated at step 300 can be stored (or cashed) in any non-transitory machine readable data storage medium known in the art. In one embodiment, the structure file can be generated in a TCAD-compatible format.

In another embodiment, the structure file can be generated in a formation that requires conversion for use in a TCAD simulation. Referring to step 400, the structure file can be converted to a graphics file.

Referring to step 500, a simulator program can use the graphics file as an input file to perform a simulation on a TCAD compatible structure file or a graphic file derived from the structure file. The simulation can be performed employing a simulator program and the structure file, as converted into a proper graphics format as needed, to determine at least one device parameter of the at least one device within the design layout. The at least one device parameter can be selected from, but is not limited to, a parasitic capacitance of the at least one device, a current-voltage curve of the at least one device, and a three-dimensional effect due to three-dimensional geometry of the at least one device.

The methods of embodiments of the present disclosure allow automatic generation of 3D TCAD structure files that are device simulation-ready from arbitrary layouts for a same set of process assumptions. Further, the methods of embodiments of the present disclosure allow automatic generation of 3D TCAD structure files that are device simulation-ready from arbitrary layouts for a plurality of sets of process assumptions. The methods of embodiments of the present disclosure allow annotation of device layouts using LLAC's. A circuit designer can specify contacts that can be placed into the structure file in order to aid automated generation of 3D TCAD device simulation-ready structure files.

Further, the methods of the present disclosure allow iterative layout and process refinement through automated 3D TCAD structure file generation and device simulation. Referring to step 600, the design layout can be modified based on the results of the simulation in a manner that attempts to rectify deficiencies in any performance metric in the original design layout as determined during the device simulation at step 500. A revised design layout can be analyzed to construct a simulation-ready structure file employing the methods of the present disclosure.

The methods of the present disclosure are applicable to any digital, analog, and radio frequency (RF) layouts. The methods of the present disclosure are also useful for extraction of capacitance using TCAD device simulation.

The methods of the present disclosure differ from prior art in many aspects. The differences include, but are not limited to, that automated generation of structural files according to the methods of the present disclosure is many orders of magnitude faster than manual coding employed in the art. The methods of the present disclosure are algorithmic, and therefore, are consistent across different layouts for same set of process assumptions. Further, the constructed structure files according to the methods of the present disclosure are consistent across different process assumptions for the same design layout. These features enable users of the methods of the present disclosure to more efficiently utilize electronic design automation (EDA) vendor tools. In some cases, more than 95% of time can be spent in running the EDA vendor tools instead of preparing inputs for the EDA vendor tools. In addition, the methods of the present disclosure brings TCAD simulation based process and layout refinement into the realm of possibility.

Figure 11:
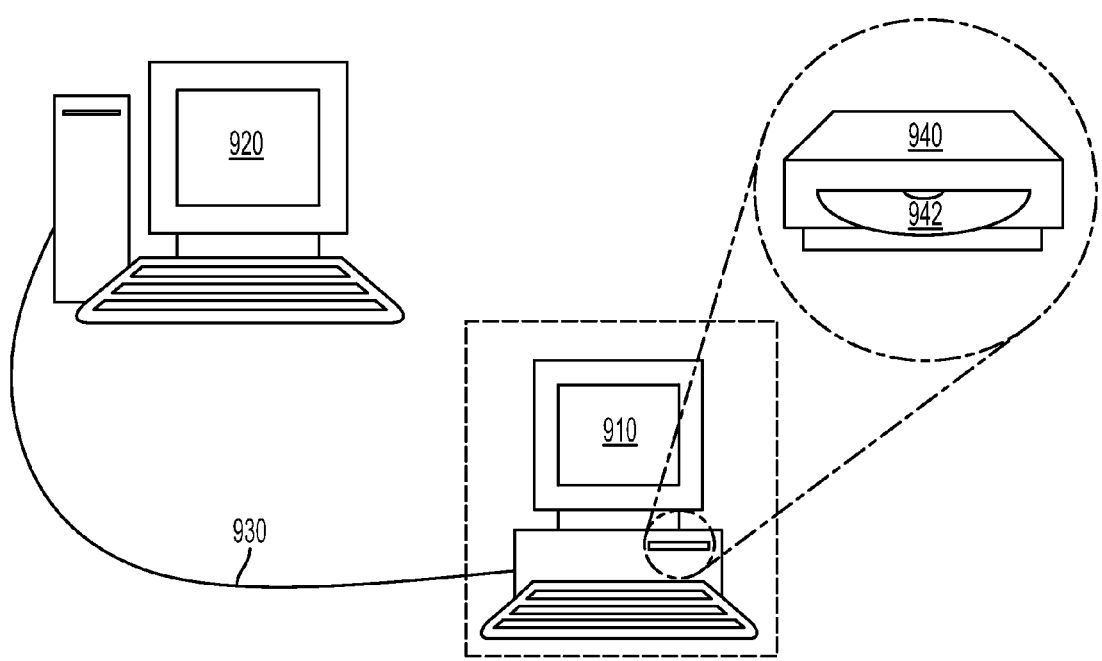
FIG. 11 is a schematic diagram of a system for manipulating a design layout of at least one device according to an embodiment of the present disclosure.

Referring to FIG. 11, a system can be provided for manipulating a design layout of at least one device. The system can include at least one computing means 910, which can include a computer. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910. The database can store a database of field effect transistor structures including corresponding finite element meshes for the field effect transistor structures from at least one design layout, which can include the manipulated design layout or from at least another design layout. Once a match between geometry of a field effect transistor among the at least one device in the manipulated design layout and the field effect transistor structures in the database is detected, the matching field effect transistor structure can be imported from the database into an intermediate structure file, which can be further manipulated to derive the structure file therefrom.

The at least one computing means 910 can be employed to perform at least one or all of steps 100, 200, 300, and 400 in FIG. 1 to manipulate a design layout of at least one device. The at least one computing means 910 can be configured to perform the various steps in FIG. 1 automatically without human intervention once a design layout is provided. Any annotated design layout and/or any intermediate structure file generated during the implementation of the method of the present disclosure can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The design layout may be iteratively modified by performing device simulations on a sequence of structure files derived from each iteration of the design layout. The final version of the design layout is transferred to a mask writing device to enable manufacturing of a set of at least one lithographic mask (reticle) encoding the final version of the third modified chip design layout. The data transfer to the mask writing device can be effected by a portable non-transitory machine-readable data storage medium 942, a data cable (not shown) or by wireless communication.

In one embodiment, the various data employed in the method of the present disclosure, including the design layout, the annotated design layout, any intermediate structure files, and the final structure file, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the third modified chip design layout.

While the present disclosure has been particularly shown and described with respect to preferred embodiments thereof, it will be understood by those skilled in the art that the foregoing and other changes in forms and details may be made without departing from the spirit and scope of the present disclosure. Each of the various embodiments of the present disclosure can be implemented alone, or in combination with any other embodiments of the present disclosure unless expressly disclosed otherwise or otherwise impossible as would be known to one of ordinary skill in the art. It is therefore intended that the present disclosure not be limited to the exact forms and details described and illustrated, but fall within the scope of the appended claims.

What is claimed is:

1. A system for manipulating a design layout of at least one device, said system comprising:
    annotating means for automatically annotating a design layout by adding annotations identifying functional components of at least one device to contact elements on design shapes corresponding to said functional components in said design layout; and
    structure-file-generating means for automatically generating a structure file from said annotated design layout employing an automated program, wherein said automated program employs a device recognition rule to identify a device type of said at least one device by analyzing design shapes of said annotated design layout and constructs a structure file representing a three-dimensional representation of said at least one device including finite element meshes.

2. The system of claim 1, wherein said automated program is configured to perform steps of:
    generating a front-end-of-line (FEOL) structure file from said annotated design layout;
    generating a back-end-of-line (BEOL) structure file from said annotated design layout; and
    merging said FEOL structure file and said BEOL structure file to generate said structure file.

3. The system of claim 2, wherein said automated program is configured to performs further steps of:
    adding FEOL finite element meshes (FEOL FEMs) to said FEOL structure file;
    adding BEOL finite element meshes (BEOL FEMs) to said BOEL structure file; and
    merging said FEOL FEMs and said BEOL FEMs to form said FEMs.

4. The system of claim 3, wherein said automated program is configured to construct said structure file by performing a step of generating a front-end-of-line (FEOL) structure file from said annotated design layout by extracting, layer by layer, a three-dimensional shape for each element representing a physical volume in a physical semiconductor device from said annotated design layout.

5. The system of claim 1, wherein said automated program is configured to construct said structure file by performing a step of generating a back-end-of-line (BEOL) structure file from said annotated design layout by extracting, layer by layer, a three-dimensional shape for each element representing a physical volume in a metal interconnect structure from said annotated design layout.

6. The system of claim 1, wherein said automated program is configured to perform steps of:
   identifying a functional device in said annotated design layout;
   extracting connectivity of said functional device to at least another functional device from said annotated design layout; and
   identifying a device circuit region including said functional device and additional functional devices having connectivity to said functional device.

7. The system of claim 1, wherein said automated program is configured to perform steps of:
   constructing a database of semiconductor device structures including corresponding finite element meshes for said semiconductor device structures from said design layout or from at least another design layout; and
   importing a matching semiconductor device structure from said database into an intermediate structure file upon detection of a match between geometry of a semiconductor device among said at least one device and said semiconductor device structures in said database, wherein said structure file is derived from said intermediate structure file.

8. The system of claim 1, wherein said automated program is configured to perform a simulation employing a simulator program employing said structure file to determine at least one device parameter of said at least one device.

9. A non-transitory machine readable data storage medium embodying a automated program for manipulating a design layout of at least one device, said automated program comprising steps of:
   annotating a design layout by adding annotations identifying functional components of at least one device to contact elements on design shapes corresponding to said functional components in said design layout; and
   generating a structure file from said annotated design layout employing an automated program, wherein said automated program employs a device recognition rule to identify a device type of said at least one device by analyzing design shapes of said annotated design layout and constructs a structure file representing a three-dimensional representation of said at least one device including finite element meshes.

10. The non-transitory machine readable data storage medium of claim 9, wherein said automated program is configured to perform steps of:
   generating a front-end-of-line (FEOL) structure file from said annotated design layout;
   generating a back-end-of-line (BEOL) structure file from said annotated design layout; and
   merging said FEOL structure file and said BEOL structure file to generate said structure file.

11. The non-transitory machine readable data storage medium of claim 9, wherein said automated program is configured to performs further steps of:
   adding FEOL finite element meshes (FEOL FEMs) to said FEOL structure file;
   adding BEOL finite element meshes (BEOL FEMs) to said BOEL structure file; and
   merging said FEOL FEMs and said BEOL FEMs to form said FEMs.

12. The non-transitory machine readable data storage medium of claim 9, wherein said automated program is configured to perform steps of:
   constructing a database of field effect transistor structures including corresponding finite element meshes for said field effect transistor structures from said design layout or from at least another design layout; and
   importing a matching field effect transistor structure from said database into an intermediate structure file upon detection of a match between geometry of a field effect transistor among said at least one device and said field effect transistor structures in said database, wherein said structure file is derived from said intermediate structure file.

13. The non-transitory machine readable data storage medium of claim 9, wherein said automated program is configured to construct said structure file by performing a step of generating a front-end-of-line (FEOL) structure file from said annotated design layout by extracting, layer by layer, a three-dimensional shape for each element representing a physical volume in a physical semiconductor device from said annotated design layout.

14. The non-transitory machine readable data storage medium of claim 9, wherein said automated program is configured to construct said structure file by performing a step of generating a back-end-of-line (BEOL) structure file from said annotated design layout by extracting, layer by layer, a three-dimensional shape for each element representing a physical volume in a metal interconnect structure from said annotated design layout.

15. The non-transitory machine readable data storage medium of claim 9, wherein said automated program is configured to perform steps of:
   identifying a functional device in said annotated design layout;
   extracting connectivity of said functional device to at least another functional device from said annotated design layout; and
   identifying a device circuit region including said functional device and additional functional devices having connectivity to said functional device.

16. The non-transitory machine readable data storage medium of claim 9, wherein said automated program is configured to perform a simulation employing a simulator program employing said structure file to determine at least one device parameter of said at least one device.

* * * * *